United States Patent
Nakajima

[11] Patent Number: 6,024,466
[45] Date of Patent: Feb. 15, 2000

[54] ELECTRONIC PARTS HOLDER

[75] Inventor: Yoshiyuki Nakajima, Kanagawa, Japan

[73] Assignee: Uniden Corp., Tokyo, Japan

[21] Appl. No.: 09/023,289

[22] Filed: Feb. 13, 1998

[30] Foreign Application Priority Data

Feb. 13, 1997 [JP] Japan ..................................... 9-029251

[51] Int. Cl.[7] ................................................. H01R 33/00
[52] U.S. Cl. ...................... 362/226; 362/800; 313/318.1
[58] Field of Search ................................... 362/396, 226,
362/306, 800; 313/500, 512, 318.09, 318.1;
257/99, 98

[56] References Cited

U.S. PATENT DOCUMENTS

| | | | |
|---|---|---|---|
| 4,959,761 | 9/1990 | Critelli et al. ............................ | 362/226 |
| 5,216,318 | 6/1993 | Van Dulmen et al. ................. | 362/226 |
| 5,291,039 | 3/1994 | Ogata et al. .............................. | 257/99 |
| 5,412,550 | 5/1995 | Hsieh et al. ............................. | 362/226 |
| 5,590,952 | 1/1997 | Cheng et al. ............................ | 362/226 |
| 5,760,537 | 6/1998 | Friederichs .......................... | 313/318.1 |

FOREIGN PATENT DOCUMENTS

| | | |
|---|---|---|
| 62-28458 | 2/1987 | Japan . |
| 2-45584 | 3/1990 | Japan . |
| 3-16112 | 2/1991 | Japan . |
| 3-59654 | 6/1991 | Japan . |
| 4-190507 | 7/1992 | Japan . |
| 5-69891 | 9/1993 | Japan . |

*Primary Examiner*—Alan Cariaso
*Attorney, Agent, or Firm*—McDermott, Will & Emery

[57] ABSTRACT

A light-emitting element is supported by hooking claw sections at tip sections of a pair of supporting arm sections onto a top surface of the flange section, and a lower section of a basic body of the light-emitting element is pressed by a tip section of an elastic member to energize the light-emitting section upward. The light-emitting section raised upward by the elastic member is positionally restricted by hooking claw sections of a pair of supporting arm sections on a flange section, thus height of the light-emitting element on a substrate being maintained at a constant level.

5 Claims, 4 Drawing Sheets

ELECTRONIC PARTS HOLDER

FIELD OF THE INVENTION

The present invention relates to an electronic parts holder, and more particularly to an electronic parts holder mounted on a substrate of electronic parts.

BACKGROUND OF THE INVENTION

FIG. 7 is a side view showing a housing with a conventional type of an electronic parts holder incorporated therein. Herein it is assumed that an electronic parts holder 70 made of synthetic resin is previously mounted on a substrate 90.

The electronic parts holder 70 has a structure in which supporting arm sections 72, 73 are provided in erected posture on an upper surface of a basic body 71 of a holder, and claw sections 72a, 73a provided at tip sections of the supporting arm sections 72, 73 respectively are spaced at a specified distance. This claw sections 72a, 73a hold therebetween, as shown in FIG. 7, a basic body 81 of a light-emitting element 80 as an object for packaging making use of elasticity of the supporting arm sections 72, 73.

In the basic body 71 of the holder, an insertion hole 74 for passing therethrough each of a pair of terminals 83, 84 of a light-emitting element 80 which is electronic parts is provided at a position lower in the vertical direction from a central position thereof of each of said claw sections 72a, 73a.

The light-emitting element 80 has a flange section 82 under a basic body 81 of the element. This flange section 82 restricts upward movement of the light-emitting element 80 when held between the claw sections 72a, 73a.

Concretely, an opening section 91a for exposing the light-emitting element 80 therethrough is provided on a front cover 91, and the opening section 91a is adjusted at a position where the claw sections 72a, 73a contact the flange section 82 and at a height where a top surface of the light-emitting element 80 does not project from the opening section 91a.

However, in the electronic parts holder 70 based on the conventional technology, if an unnecessary clearance is generated between the flange section 82 of the light-emitting element 80 and the claw sections 72a, 72b, as shown in FIG. 7, a top surface of the light-emitting element 80 goes lower than an opening section 91a, so that an emission angle of a light beam emitted from the opening section 91a becomes narrower.

In this case, light emission lacks when the front cover 91 is viewed from the diagonal direction, which disadvantageously results in degradation of the light-emitting element. Especially, a smoke window is covered over the front cover 91, it is extremely difficult to confirm light emission from the light-emitting element 80.

It should be noted that, as an alternative structure for mounting the light-emitting element 80 on a substrate, there is a spacer structure (not shown herein) in which a spacer made of, for instance, rubber is attached to terminals 83, 84 of the light-emitting terminal 80. In the above-described structure in which the claw sections 72a, 73a are employed, projection of the basic body 81 of the element to the front cover 91 is prevented by a hooking structure between the flange section 82 and the claw sections 72a, 73a, but in this spacer structure, not only projection but also sinking of the basic body 81 of the element 81 can be prevented.

Generally, as in a case of the light-emitting element shown in FIG. 7, abank section 85 is generated at a joint section of each of the terminal 72a, 73a of the basic body 81 of the element. Because of this bank section, in a case where a dimensional tolerance of the bank section 85 amounts up to 1.5 mm, large influence appears in a height of the basic body 81 of the element when mounted in a housing, which in turn causes an incorporating error in the housing.

In other words, the basic body 81 of the element is raised upward by a space with the band section 85 according to the dimensional error of the bank section 85, so that the basic body 81 of the element presses the front cover, which sometimes generates a pattern error.

Especially to suppress loss in light emission from the light-emitting element 80, it is necessary to minimize a distance between a front cover and a top surface of a basic body 81 of the element, and also in relation to this requirement influence of non-uniformity in a dimensional tolerance of the band section 85 over quality of a housing is substantially large.

SUMMARY OF THE INVENTION

It is an object of the present invention to provide an electronic parts holder which does not generate pattern breakage and can prevent partial lack of light emission from a light-emitting element after assembled into a housing and also which provides qualitative improvement of electronic devices.

With the present invention, a light-emitting element is supported by hooking a tip section of an elastic supporting section onto a top surface of a flange section and also the light-emitting element is energized upward by pressing a lower section of a basic body of the light-emitting element with the tip section of the elastic supporting member, so that the light-emitting element being upward by the elastic member can positionally be restricted by the elastic supporting member. With this feature, a height of the light-emitting element on a substrate is maintained at a constant level, so that pattern breakage or partial lack of light emission from the light-emitting element after assembled into a housing can be prevented, and also the quality of electronic devices can be improved.

With the present invention, a light element is supported by hooking a claw section of a tip section of each of a pair of supporting arm sections, and the light-emitting element is energized upward by pressing a lower section of the basic body of the light-emitting element with the tip section of the elastic member, so that the light-emitting element being raised upward by the elastic member can positionally be restricted by hooking a claw section of each of a pair of supporting arm sections. With this feature, a height of the light-emitting element on a substrate can be maintained at a constant level, so that pattern breakage and partial lack of light emission from the light-emitting element can be prevented, and also quality of electronic devices can be improved.

With the present invention, when the elastic member deforms downward, a stopper member provided on the basic body of the holder contacts a tip section of the elastic section, so that, even if the elastic member is pushed downward in association with movement of the light-emitting element, the deformation is restricted at a point of time when the elastic member contacts the stopper member, and with this feature it is possible to prevent the elastic member from deforming beyond a limit of the elastic deformation.

Other objects and features of this invention will become understoodfromthe followingdescriptionwithreference to the accompanying drawings.

DESCRIPTION OF PREFERRED EMBODIMENTS

Detailed description is made hereinafter for one of preferred embodiments of the present invention with reference to the related drawings.

Figure 1:
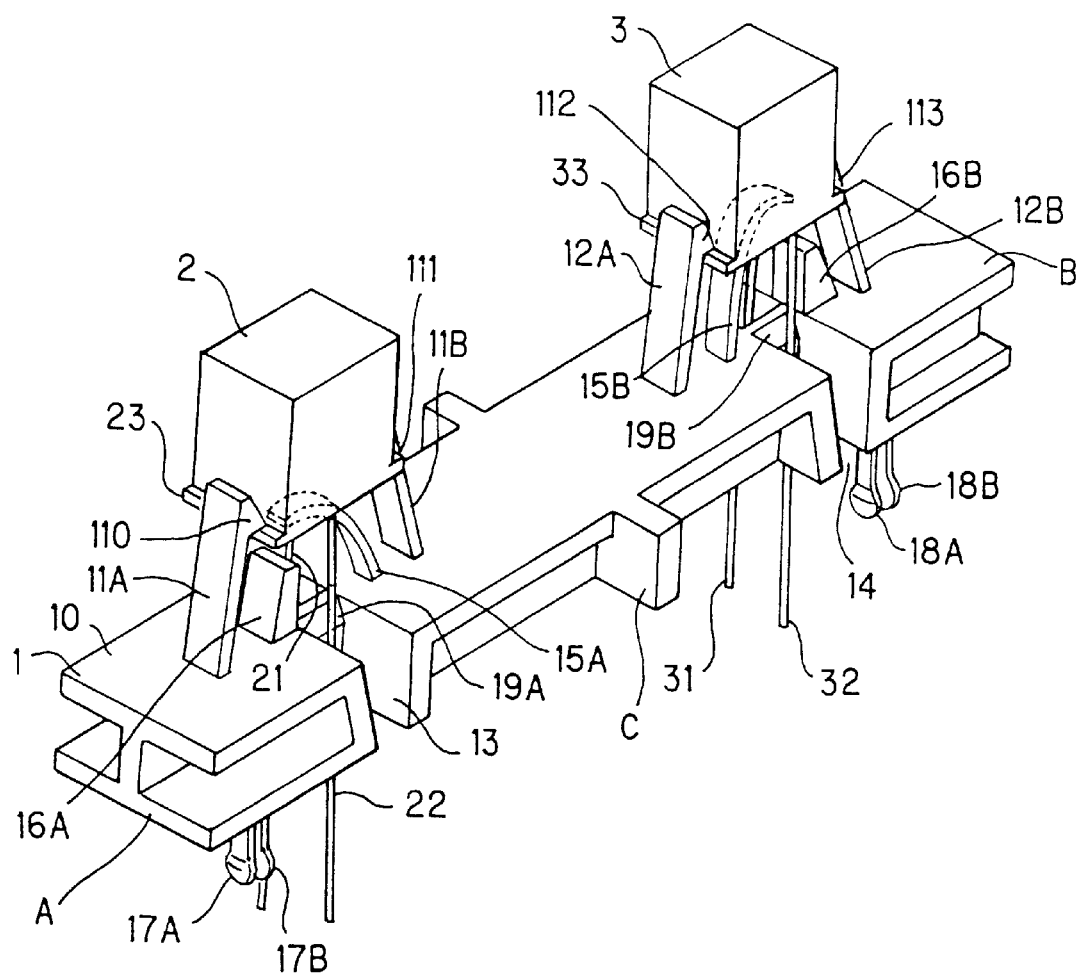
FIG. 1 is an external appearance view showing an electronic parts holder according to one embodiment of the present invention.

FIG. 1 is a perspective appearance view of the electronic parts holder according to one of embodiments of the present invention.

In FIG. 1, a light-emitting element holder 1 is an electronic parts holder for holding light-emitting elements 2, 3 on a substrate which is not shown herein at a specified height, and the light-emitting elements 2, 3 are electronic parts each having the same function with two terminals 21, 22, 31, 32 and flange sections 23, 33 formed on a basic body of the light-emitting element respectively.

The light-emitting element holder 1 comprises a basic body 10 of the holder detachably mounted on the substrate not shown herein; two pairs of supporting arm sections 11A, 11B as well as 12A, 12B each pair provided in erected posture on the basic body 10 of the holder spaced at a specified distance from each other respectively; elastic members 15A, 15B provided in erected posture between one of the pairs of supporting arm sections 11A, 11B and between the other pair of supporting arm sections 12A, 12B respectively each on the basic body of the holder 1; stopper members 16A, 16B provided in erected posture between one of the pairs of supporting arm sections 11A, 11B and between the other pair of supporting arm sections 12A, 12B respectively each on the basic body of the holder; and two pairs of engaging claws 17A, 17B as well as 18A, 18B each provided for mounting the basic body of the light-emitting elements holder 1 on the substrate which is not shown herein.

The light-emitting element holder 1 is entirely formed with synthetic resin so that the holder can obtain elasticity and flexibility.

The basic body 10 of the holder comprises edge sections A, B each having a I-shaped structure in the cross section in its longitudinal direction and an intermediate section C having a T-shaped structure in cross section with connecting section 19A, 19B connected to the edge sections A, B, respectively.

The connecting section 19A of the basic body 10 of the holder has a length for spacing the edge section A and the intermediate section C at a specified distance so that the connecting section 19A is present between the terminals 21 and 22 when the light-emitting element 2 is mounted on the holder 10. With this feature, a terminal insertion section 13 with a shape divergent in the upper direction in the arrangement shown in FIG. 1 is formed between the edge section A and the intermediate section C.

Similarly, the connecting section 19B of the basic body 10 of the holder has a length for spacing the edge section B and the intermediate section C at a specified distance so that the connecting section 19B is present between the terminals 31 and 32 when the light-emitting element 3 is mounted on the holder 10. With this feature, a terminal insertion section 14 with a shape divergent in the upper direction in the arrangement shown in FIG. 1 is formed between the edge section B and the intermediate section C.

The pair of supporting arm sections 1A, 11B have claw sections 110, 111 provided at the tip sections thereof respectively so that the claw sections are opposite to each other and support the light-emitting element 2 by hooking those two claw sections 110, 111 on an upper surface of the flange section 23 of the light-emitting element 2. In this case, the supporting arm sections 11A, 11B hold the basic body of the light-emitting element 2 with the claw sections 110, 111 by making use of their own elasticity.

Similarly, the pair of supporting arm sections 12A, 12B have claw sections 112, 113 provided at the tip sections thereof respectively so that the claw sections are opposite to each other and support the light-emitting element 2 by hooking those two claw sections 112, 113 on an upper surface of the flange section 33 of the light-emitting element 2. In this case, the supporting arm sections 12A, 12B hold the basic body of the light-emitting element 2 with the claw sections 112, 113 by making use of their own elasticity.

The elastic member 15A is bent to form an arch shape with one edge thereof fixed to the basic body 10 of the holder, and the other edge thereof (tip section thereof) presses the lower section of the basic body of the light-emitting element 2 to energize the light-emitting element 2 upward. This elastic member 15A functions as a flat spring.

Similarly, the elastic member 15B is bent to form an arch shape with one edge fixed to the basic body 10 of the holder, and the other edge thereof (tip section thereof) presses the lower section of the basic body of the light-emitting element 3 to energize the light-emitting element 3 upward. This elastic member 15B also functions as a flat spring as the elastic member 15A does.

It should be noted that each tip section of the elastic members 15A, 15B is provided with the width narrower as compared to an inner space between the two terminals 21, 22 (31, 32) of the light-emitting element 2 (3) and a position for pressing the light-emitting element 2 (3) is set between the two terminals 21, 22 (31, 32).

The stopper member 16A is provided on an orbit of the tip section of the elastic member 15A when the elastic member 15A deforms downward on the basic body 10 of the holder. This stopper member 16A has a function of restricting a deformation rate of the elastic member 15A by contacting the tip section thereof.

The stopper member 16B is provided on an orbit of the tip section of the elastic member 15B when the elastic member 15B deforms downward on the basic body 10 of the holder. This stopper member 16B has a function of restricting a deformation rate of the elastic member 15B by contacting the tip section thereof.

Figure 2:
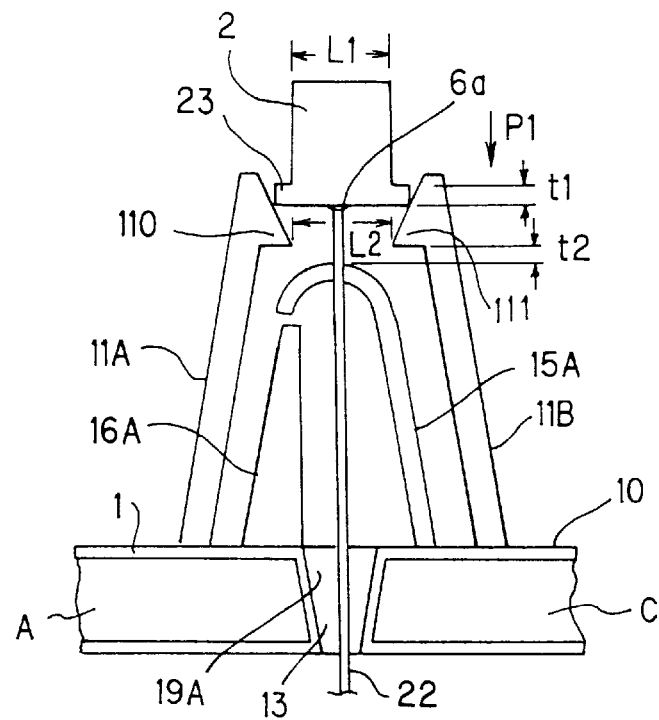
FIG. 2 is a side view showing an assembling sequence according to this embodiment.
Figure 3:
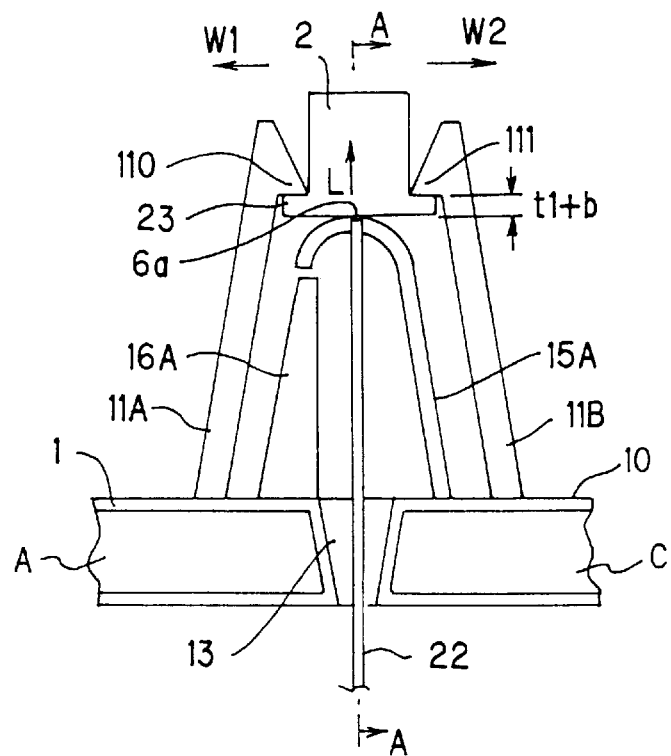
FIG. 3 is a side view showing an assembling sequence according to this embodiment.
Figure 4:
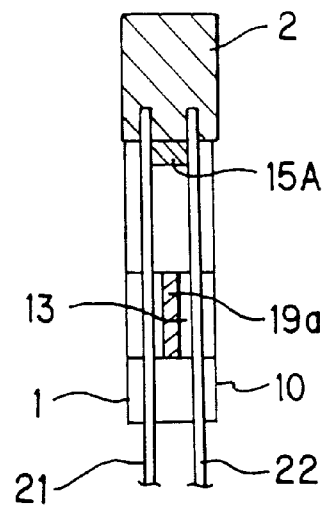
FIG. 4 is a cross-sectional view showing a cross section taken along line A—A in FIG. 3.
Figure 5:
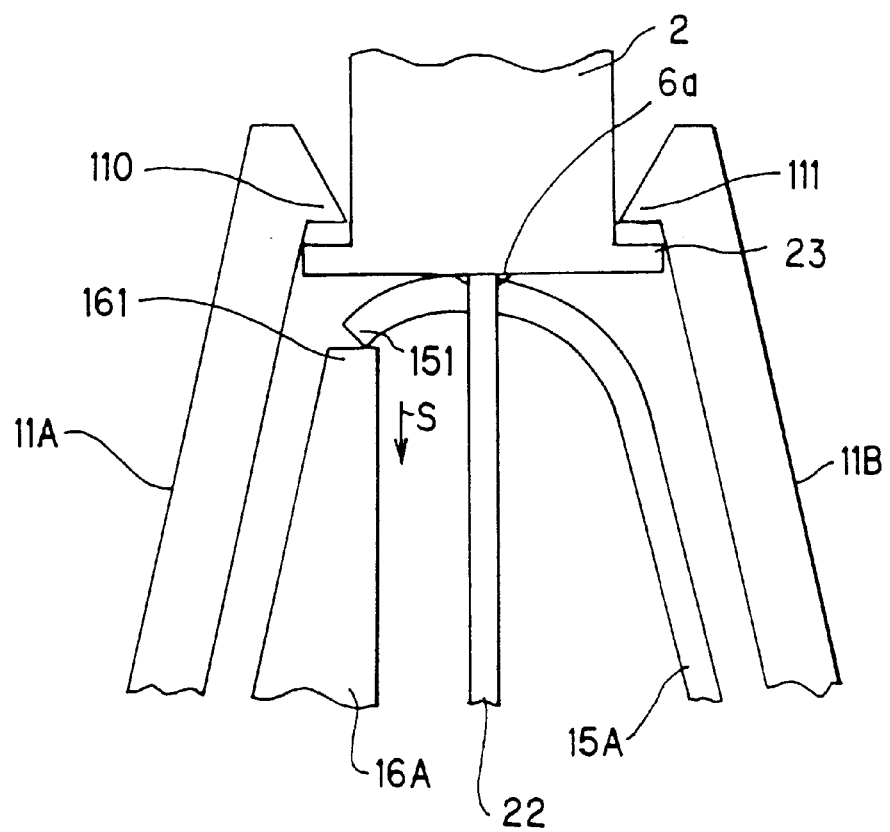
FIG. 5 is a side view showing functions of a light-emitting element holder according to this embodiment.
Figure 6:
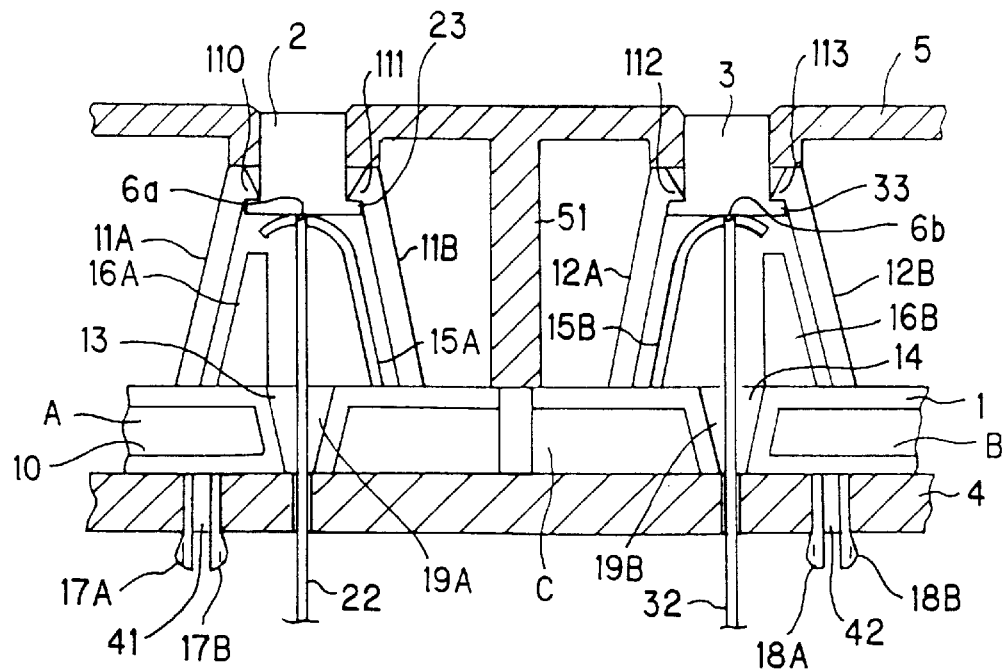
FIG. 6 is a side cross-sectional view showing a housing according to this embodiment.
Figure 7:
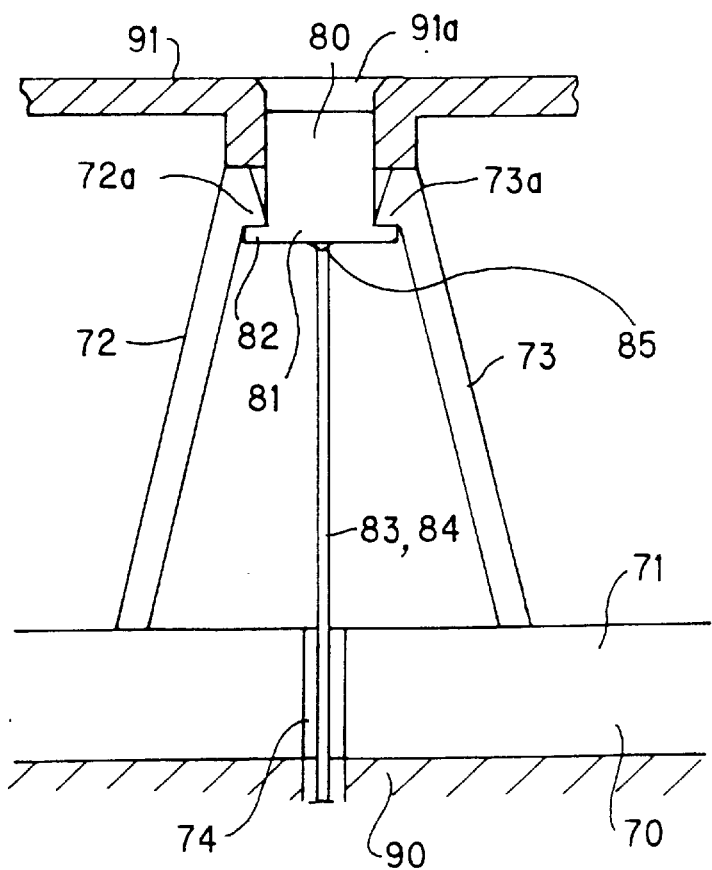
FIG. 7 is a side view showing a housing with an electronic parts holder based on the conventional technology incorporated therein.

Next description is made for a sequence of assembling the holder. FIG. 2 and FIG. 3 are side views each for explanation of the assembling sequence according to the embodiment, FIG. 4 is a cross-sectional view showing the cross section taken along A—A in FIG. 3, FIG. 5 is a side view for explanation of a function of the light-emitting elements holder in the embodiment, and FIG. 6 is a sectional side view showing a housing in the embodiment. It should be noted that, in FIG. 2, FIG. 3, FIG. 5, and FIG. 6, the reference numerals 6a, 6b indicate bank sections of epoxy resin with dimensional tolerances of about 0.1 mm generated due to mounting of the terminals 21, 22, 31, 32 of the light-emitting elements 2, 3 thereon respectively. However, there is sometime a case where each of the bank sections 6a, 6b may have the maximum dimensional tolerances of 1.5 mm, so that the bank sections are dimensionally not uniform.

Description is made hereinafter for a sequence of incorporating the light-emitting element 2 in the light-emitting elements holder 10, but description for that of the light-emitting element 3 is omitted herein because it is the same as that for the element 2.

As for dimensional relations between the light-emitting element 2 and the basic body 10 of the holder, as shown in FIG. 2, a width (L1) of the basic body of the light-emitting element 2 and a distance (L2) between the tip sections of the claw sections 110, 111 (supporting arm sections 11A, 11B) are set so that the relation therebetween is L1≧L2, and a thickness (t1) of the flange section 23 of the light-emitting element 2 and an elevation distance (t2) between the claw sections 110, 111 and the top of the elastic member 15A are set so that the relation therebetween is t1≧t2.

In the relation shown in FIG. 2, when the light-emitting element 2 is pushed into the basic body 10 of the holder in the direction (downward) indicated by the arrow P1, the edge of the flange section 23 of the light-emitting element 2 is guided downward while it is sliding along the surface of the claw sections 110, 111 which are provided opposite to each other with its downward movement widening the space between the claw sections 110, 111 in the directions indicated by the reference numerals W1, W2 as shown in FIG. 3. It should be noted that, in this operation, as shown in FIG. 4, there is the elastic member 15A between the terminals 21, 22 of the light-emitting element 2.

Then, when the flange section 23 goes beyond the tips of the claw sections 110, 111, the claw sections 110, 111 tries to return to the initial positions because of the elasticity of the supporting arm sections 11A, 11B, but the claw sections 110, 111 are stopped at that time in a state of holding the basic body of the light-emitting element 2 as shown in FIG. 3. It should be noted that the holding strength becomes stronger as L1 is set to a value larger than L2.

At this time, downward movement of the light-emitting element 2 is restricted because the lower section of the basic body of the light-emitting element 2 contacts the top of the elastic member 15A. Namely, at this point of time, the elastic member 15A presses (energizes) the light-emitting element 2 in the direction indicated by the arrow L (upward). It should be noted that the pressing strength of the elastic member 15A to light-emitting element 2 becomes stronger as t1 is set to a value larger than t2.

Since the bank section 6a has a dimensional tolerance b (for instance, 0.1 mm), an elevation distance between the claw sections 110, 111 and the top of the elastic member 15A becomes t1+b.

However, the initial elevation distance between the tip section of the elastic member 15A and the stopper member 16A is larger than t1−t2+b, and at the same time the light-emitting element presses the elastic member 15A down in the direction indicated by the arrow S (downward) as shown in FIG. 5, which makes the elastic member 15A elastically deform as far as a tip section 151 of the elastic member 15A contacts a stopper surface 161 of the stopper member 16A.

As described above, when the light-emitting element 2 has been incorporated in the basic body 10 of the holder, the light-emitting element 3 is incorporated in the basic body 10 of the holder in the same sequence as described above. Then, a front cover 5 is covered over the parts to make a housing.

It should be noted that it is assumed that the light-emitting element holder 1 is previously mounted on a substrate 4 before the light-emitting elements 2, 3 are incorporated therein. Provided on the substrate 4 are engaging claw-insertion holes 41, 42 each spaced at a distance between the engaging claws 17A, 17B and between 18A, 18B respectively, and the engaging claws 17A, 17B are passed through the engaging claw-insertion hole 41 and the engaging claws 18A, 18B are passed through the engaging claw-insertion hole 42.

The front cover 5 comprises a rib 51 functioning as a spacer, and window sections 52, 53 opened so that each light emission by the light-emitting elements 2, 3 can be checked from the outside respectively.

When the front cover 5 has been placed over the light-emitting elements 2, 3, the light-emitting elements 2, 3 are provided at appropriate positions respectively in which they are not exposed from the window sections 52, 53 and lack of any light emission does not occur.

At that time, the flange in the rear side of the window section 52 is set to contact the upper sections of the claw sections 110, 111, and the flange in the rear side of the window section 53 is provided spaced at a distance so that it does not contact the upper sections of the claw sections 112, 113, furthermore the tip section of the rib 51 is provided spaced at a distance so that it does not contact the intermediate section C (the basic body 10 of the holder). As described above, the front cover 5, light-emitting elements 2, 3, light-emitting elements holder 1, and the substrate 4 are integrated.

As described above, with the embodiment, the light-emitting element 2 (3) is supported by hooking the claw sections 110, 111 (112, 113) provided at the tip sections of 10 the pair of supporting arm sections 11A, 11B (12A, 12B) on the top surface of the flange section 23 (33), the light-emitting element 2 (3) is energized upward by pressing the lower section of the basic body of the light-emitting element 2 (3) with the tip section of the elastic member 15A (15B), so that the light-emitting element 2 (3) pressed upward by the elastic member 15A (15B) can be restricted to its position by hooking the claw sections 110, 111 (112, 113) of the pair of supporting arm sections 11A, 11B (12A, 12B) on the flange section 23 (33).

With this feature, a height of the light-emitting element 2 (3) on the substrate 4 can be maintained at a specified level, so that pattern breakage or partial lack of light emission from the light-emitting element 2 (3) can be prevented after assembled into the housing, which makes it possible to improve quality of electronic devices.

Also, the elastic members 15A, 15B are flat springs, so that these elastic members 15A, 15B can be molded together with the basic body 10 of the holder as one unit, and with this molding, manufacturing cost can be reduced.

When the elastic members 15A, 15B deform downward respectively, the stopper members 16A, 16B provided on the basic body 10 of the holder contact the tip sections of the elastic members 15A, 15B, respectively, so that both of the members can be restricted to their deformation at the point of time when contacting the stopper members 16A, 16B even if the elastic members 15A, 15B are pressed downward due to the movement of the light-emitting elements 2, 3, and with this feature, such deformation of the elastic member exceeding a limit of its elasticity can be prevented.

The elastic member 15A (15B) is provided with a width of the tip section thereof narrower as compared to an inner space between the two terminals 21, 22 (31, 32) of the light-emitting element 2 (3) and a position for pressing the light-emitting element 2 (3) by the tip section of the elastic member 15A (15B) is set between the two terminals 21,22 (31, 32), so that movement of the tip section of the elastic member 15A (15B) in the direction in which the terminals are arrayed is restricted by the terminals 21, 22 (31, 32) of the light-emitting element 2 (3), and with this feature, the tip section of the elastic member 15A (15B) can accurately press up the lower section of the light-emitting element 2 (3).

As described above, with the electronic parts holder according to the present invention, a light-emitting element is supported by hooking a tip section of an elastic supporting member on a top surface of a flange section thereof and a lower section of a basic body of the light-emitting section is pressed by the tip section of the elastic member to energize the light-emitting element upward, so that the light-emitting element raised upward by the elastic member can positionally be restricted. With this feature, a height of the light emitting element can be maintained at a specified height, and pattern breakage or partial lack of light emission from the light-emitting element can be prevented after assembled into a housing, so that it is possible to provide an electronic parts holder which can improve quality of electronic devices.

With the electronic parts holder according to the present invention, a light-emitting element is supported by hooking each of claw sections at tip sections of a pair of supporting arm sections onto a top surface of a flange section thereof, and a lower section of a basic body of the light-emitting element is pressed by a tip section of an elastic member to energize the light-emitting element upward, so that the light-emitting element raised upward by the elastic member can positionally be restricted by hooking claw sections of a pair of supporting arm sections onto the flange section. With this feature, the light-emitting element on a substrate is maintained at a specified level, so that it is possible to provide an electronic parts holder which can improve quality of electronic devices.

With the electronic parts holder according to the present invention, an elastic member used therein is a flat spring, so that the elastic member can be integrated with a basic body of a holder, and with this feature it is possible to provide an electronic parts holder which enables reduction of production cost.

With the electronic parts holder according to the present invention, when the elastic member deforms downward, a stopper member provided on a basic body of the holder contacts a tip section of the elastic member, so that, even if the elastic member is pushed down in association with movement of the light-emitting element, the deformation is restricted at a point of time when the elastic member contacts the stopper member, and with this feature, it is possible to provide an electric parts holder which can prevent deformation exceeding the limit of elasticity.

With the electronic parts holder according to the present invention, width of a tip section of the elastic member 3 is narrower as compared to an internal space between two terminals of the light-emitting section, and also a position where the tip section of the elastic member presses the light-emitting section is set between the two terminals, so that movement of the tip section of the elastic member in the direction in which two terminals of the light-emitting section are arrayed is restricted, and with this feature it is possible to provide an electric parts holder in which the tip section of the elastic member can accurately press a lower section of the light-emitting section.

This application is based on Japanese patent application No. HEI 9-029251 filed in the Japanese Patent Office on Feb. 13, 1997, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An electronic parts holder for holding a light-emitting element having two terminals and a flange section formed on a basic body of the light-emitting element at a specified height on a substrate comprising:

a basic body of the holder detachably mounted on said substrate;

a supporting member provided in its erected posture on said basic body of the holder and supporting said light-emitting element hooking a tip section of said supporting member on an upper surface of said flange section; and an elastic member provided in its erected posture on said basic body of the holder and pressing a lower section of said basic body of the light-emitting element with its tip section to urge said light-emitting element upward;

wherein said supporting member and said elastic member securely hold the light-emitting element at the specified height.

2. An electronic parts holder for holding a light-emitting element having two terminals and a flange section formed on a basic body of the light-emitting element at a specified height on a substrate comprising:

a basic body of the holder detachably mounted on said substrate;

a pair of supporting arm sections each provided in its erected posture on said basic body of the holder spaced at a specified distance from each other and also each having a claw section opposite to that of the other provided at a tip section thereof, said pair of supporting arm sections holding said light-emitting element hooking the two claw sections on a upper surface of said flange section; and an elastic member provided in its erected posture on said basic body of the holder and pressing a lower section of said basic body of the light-emitting element with its tip section to urge said light-emitting element upward.

3. An electronic parts holder according to claim 2; wherein said elastic member is a flat spring.

4. An electronic parts holder according to claim 3; wherein a stopper member contacting the tip section of said elastic member is provided on a orbit of the tip section of said elastic member when said elastic member deforms downward on said basic body of the holder.

5. An electronic parts holder according to claim 3; wherein the tip section of said elastic member is provided with the width narrower as compared to an inner space between said two terminals of said light-emitting element and a position for pressing said light-emitting element is set between said two terminals.

* * * * *